United States Patent [19]

Shimada et al.

[11] Patent Number: 5,894,295
[45] Date of Patent: Apr. 13, 1999

[54] IMAGE DISPLAY DEVICE

[75] Inventors: Takayuki Shimada, Yamatokoriyama; Atsushi Ban; Masaya Okamoto, both of Soraku-gun, all of Japan

[73] Assignee: Sharp Kabushiki Kaisha, Osaka, Japan

[21] Appl. No.: 08/570,964

[22] Filed: Dec. 12, 1995

[30] Foreign Application Priority Data

Dec. 26, 1994 [JP] Japan ..................... 6-323306

[51] Int. Cl.[6] ..................................... G09G 3/18
[52] U.S. Cl. ........................... 345/93; 345/92; 327/526
[58] Field of Search ........................ 345/93, 103, 87, 345/100, 204, 205, 92; 349/54, 55, 42; 327/526

[56] References Cited

U.S. PATENT DOCUMENTS

| 4,688,896 | 8/1987 | Castlleberry | 345/103 |
| 4,807,973 | 2/1989 | Kawasaki | 345/93 |
| 4,840,459 | 6/1989 | Strong | 345/87 |
| 5,268,678 | 12/1993 | Nakazawa et al. | 345/93 |
| 5,392,245 | 2/1995 | Manning | 327/526 |
| 5,555,001 | 9/1996 | Lee et al. | 345/93 |
| 5,625,373 | 4/1997 | Johnson | 345/100 |

FOREIGN PATENT DOCUMENTS

| 0324204 | 7/1989 | European Pat. Off. | 345/93 |

*Primary Examiner*—Lun-Yi Lao
*Attorney, Agent, or Firm*—Nixon & Vanderhye, P.C.

[57] ABSTRACT

A plurality of source signal lines which supplies display data of picture elements, which are sampled at a sampling gate, from a video signal line to a plurality of picture element TFTs arranged in a matrix pattern, and a plurality of gate signal lines that supplies a control signal for controlling the picture element TFTs and that intersect the source signal lines are provided to a display section. A spare wiring is formed on each source signal line or gate signal line so that the spare wiring intersects only a non-input end of each source signal line or of each gate signal line. A corrective signal supplying circuit for supplying a corrective signal of display data or a corrective signal of the control signal for controlling picture element TFTs is provided to the outside of the display section. As a result, a line breakdown can be completely corrected.

4 Claims, 5 Drawing Sheets

IMAGE DISPLAY DEVICE

FIELD OF THE INVENTION

The present invention relates to an image display device, such as liquid crystal display devices, EL emitters and plasma emitters, and relates to a correcting method for correcting faults in such image display device.

BACKGROUND OF THE INVENTION

CRTs as image display devices have been replaced by matrix-type display devices utilizing liquid crystal, EL emitters, plasma emitters, etc. In particular, liquid crystal display devices utilizing liquid crystal are used in various applications, such as portable TV sets, word processors, and personal computers.

As to image display devices used in the above equipments, minute and larger-sized devices are desired. In order to display minute images, it is necessary that picture elements constituting a matrix be very small in size and very great in number. However, an increase in the number of picture elements requires an increase in the number of bus lines that function as gate signal lines and source signal lines. The larger the number of bus lines, the more is a line breakdown likely to occur. Moreover, as display devices become larger in size, bus lines become larger in length. As such, it is now becoming increasingly difficult to fabricate break-free bus wiring. Meanwhile, in production of such an image display device, increasing non-defective products is important subject for a decreasing production cost.

In order to solve the above problems, there has been developed a matrix-type display device having a function to correct bus-line breaks (see Japanese Unexamined Patent Publication No. 3-23425/1991 (Tokukaihei 3-23425)).

The following describes the function to correct bus-line breaks in the matrix-type display device disclosed in the above Publication.

Figure 4:
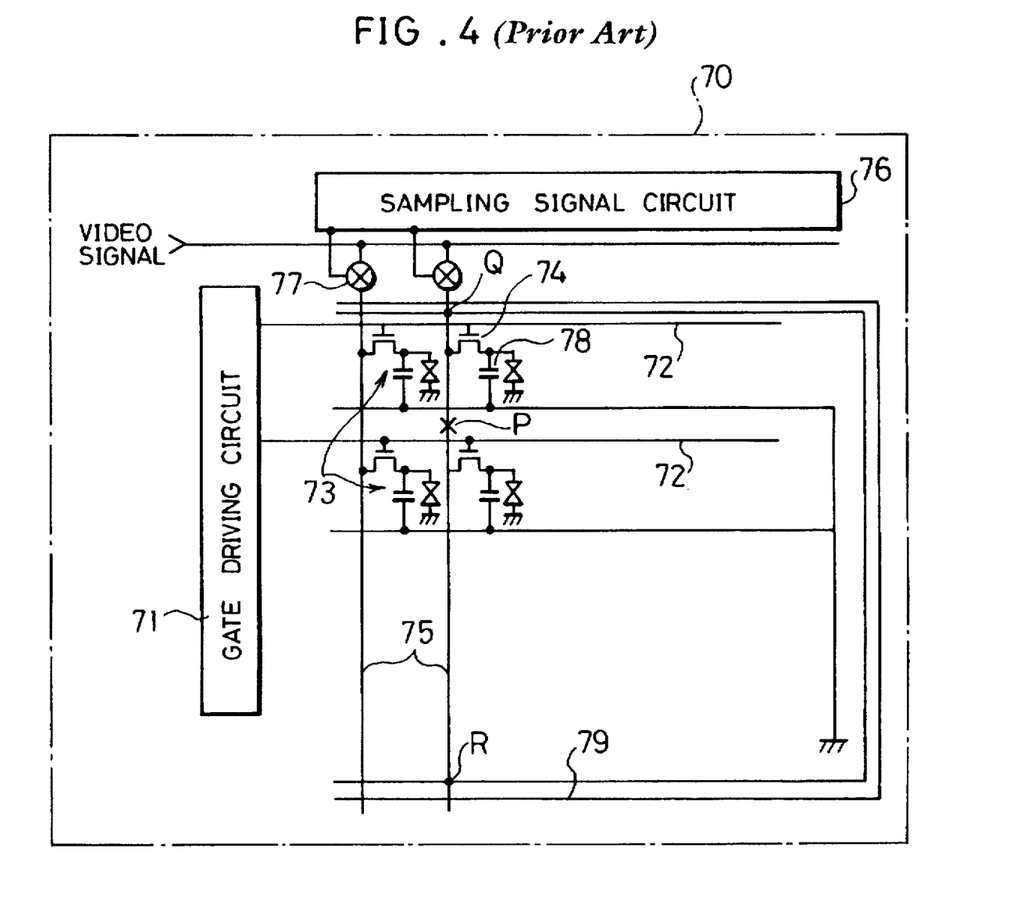
FIG. 4 is a schematic drawing which shows a conventional liquid crystal display device which is capable of correcting a defect.

As shown in FIG. 4, in a display section 70 of a liquid crystal display device as the matrix-type display device, a signal which drives picture element TFTs 74 for picture elements 73 are outputted from a gate driving circuit 71 through gate signal lines 72.

Meanwhile, a video signal is sampled by sampling gates 77, which is controlled by a sampling signal circuit 76, and the sampled video signal is outputted to source signal lines 75. A picture element capacitance 78 is connected to a drain electrode of the picture element TFT 74, and an image is displayed by liquid crystal sealed between the drain electrode and a counter electrode, not shown.

In such a liquid crystal display device, in order to relieve breaking of source signal lines 75, a wiring 79 is formed so as to surround three sides of the display section 70.

The wiring 79 intersects the source signal lines 75 respectively on the signal input side (upper side seen from the drawing) of the source signal lines 75 and on the non-signal input side (lower side seen from the drawing) of the source signal lines 75.

If a breakdown of the source signal lines 75 occurs at a point "P" in the drawing, the line breakdown is corrected in the following manner.

The intersections "Q" and "R" of the wiring 79 and the source signal lines 75 are connected by irradiation of a laser. As a result, in a section below the point "P" seen from the drawing, since a source signal is inputted from the non-signal input side of the source signal line 75, a normal image can be displayed.

However, there arises the following problem in the above-mentioned conventional image display device when a breakdown of the source signal lines 75 is corrected by connecting up and down of the source signal lines 75 through the wiring 79 formed around the display section 70.

In other words, since the wiring 79 is placed along the display section 70, so the length of the wiring 79 becomes longer, and since the wiring 79 intersects a lot of source signal lines 75, a parasitic capacitance of the wiring 79 is much larger than of the source signal lines 75. Namely, its parasitic capacitance becomes as large as that in the case where a source signal line capacity for making signal holding properties stable is provided to source signal lines 75 in a general VGA (Video Graphics Alley)-class liquid crystal display device.

Therefore, in a corrected portion, delay and distortion of a signal occur and an offset amount due to feedthrough of the sampling gates 77 is different from in an uncorrected normal portion. As a result, there arises a problem that a line breakdown cannot be completely corrected.

This problem becomes more significant in a driver monolithic-type liquid crystal display device because a driving circuit 71, a signal circuit 76 and sampling gates 77 are arranged by using a TFT that has inferior driving capacity to on LSI.

SUMMARY OF THE INVENTION

It is an object of the present invention to provide an image display device and a method for correcting its defect which can completely correct defects, such as line breakdowns and short circuits.

In order to achieve the above object, an image display device of the present invention has a plurality of picture elements that are provided with a switching element and that are arranged in a matrix pattern, a plurality of source signal lines and a plurality of gate signal lines that intersect at right angles each other and that is provided in order to supply a signal to the picture elements, and corrective signal supplying circuit which are capable of supplying a corrective signal, that is substituted for an input signal of each revisable signal line, to each revisable signal line from its corrective end and that is arranged closer to the corrective end of a non-input side of a revisable signal line, which is at least one of said source signal lines or said gate signal lines, than an end of an input side.

In accordance with the above arrangement, if a defective portion is produced due to a line breakdown of the revisable signal line, etc., the corrective signal supplying circuit can supply a corrective signal from the corrective end of the revisable signal line to picture elements of the defective revisable signal line. Since the corrective signal supplying circuit is provided closer to the non-input side than the input side of the revisable signal line, a supplying path for supplying a signal to picture elements of the defective revisable signal line can be shortened compared with a conventional supplying path that supplies a signal to picture elements through three sides of the display section where a plurality of picture elements are provided. Moreover, a number of intersection of the gate signal lines or the source signal lines and of the supplying path can be reduced. As a result, resistance and parasitic capacitance of the supplying path can be reduced compared with the conventional one.

If resistance and parasitic capacitance of the supplying path to a defective portion are extremely large compared with resistance and parasitic capacitance of normal source signal line or gate signal line, a display state of normal picture elements is different from a display state of picture element of the defective revisable signal line because of capacitance and a size of picture element, and resistance and parasitic capacitance of each source signal line or each gate signal line, so the difference in the display state can be visually recognized. In other words, since the resistance and parasitic capacitance are large, delay and distortion occur in a signal to be supplied to picture elements of the defective revisable signal line, and for example, an offset and a level due to feedthrough of the sampling gate sometimes change. However, since the resistance and parasitic capacitance of the supplying path to picture elements of the defective revisable signal line can be reduced, the delay can be controlled, thereby completely correcting a defective portion.

In addition, it is desirable that the image display device has at least one spare wiring, which intersect at right angles the corrective end of each revisable signal line so that it can be connected to the revisable signal line at their intersect, as the supplying path. In accordance with this arrangement, if a defect portion is produced, the corrective signal supplying circuit supplies a corrective signal to the defective portion through the spare wiring. Moreover, the spare wiring is formed only on the non-input end of each source signal line or of gate signal line. For this reason, the length of the spare wiring becomes shorter than that of a conventional spare wiring which is installed along three sides of a display section. Therefore, its parasitic capacity can be securely reduced, and a defective portion can be completely corrected. The spare wiring can be easily connected to the revisable signal line by emission of a laser beam, etc.

In addition, the image display device may have a spare wiring for transmitting a generation control signal that controls generation of a corrective signal instead of the spare wiring for directly transmitting the corrective signal. In this case, the corrective end of each revisable signal line is provided with generating circuit for generate a corrective signal, such as a corrective sampling gate. Furthermore, each generation control line for supplying the generation control signal to each generating circuit can be connected to the spare wiring. Moreover, the spare wiring is connected to the control circuit for generating the generation control signal.

Also in the case, the length of the spare wiring can be shortened compared with a conventional one, so its parasitic capacity can be securely reduced. In addition, each generating circuit, such as a corrective sampling gate and a plurality of picture elements can be integrally formed and correction is carried out per revisable signal line. Therefore, the defective portion can be securely and completely corrected even when the arrangement of the externally provided control circuit is simplified.

Meanwhile, a method for correcting a short circuit of each image display device has the steps of specifying a short-circuited portion between the source signal line and the gate signal line, disconnecting the revisable signal line having a short-circuited portion in the vicinities of the both sides of the short-circuited portion, and supplying the corrective signal to the defective line by the corrective signal supplying circuit. As a result, the short circuit can be securely corrected. At least one of the source signal line and the gate signal line is always a revisable signal line.

For fuller understanding of the nature and advantages of the invention, reference should be made to the ensuing detailed description taken in conjunction with the accompanying drawings.

DESCRIPTION OF THE EMBODIMENTS

EMBODIMENT 1

Figure 1A:
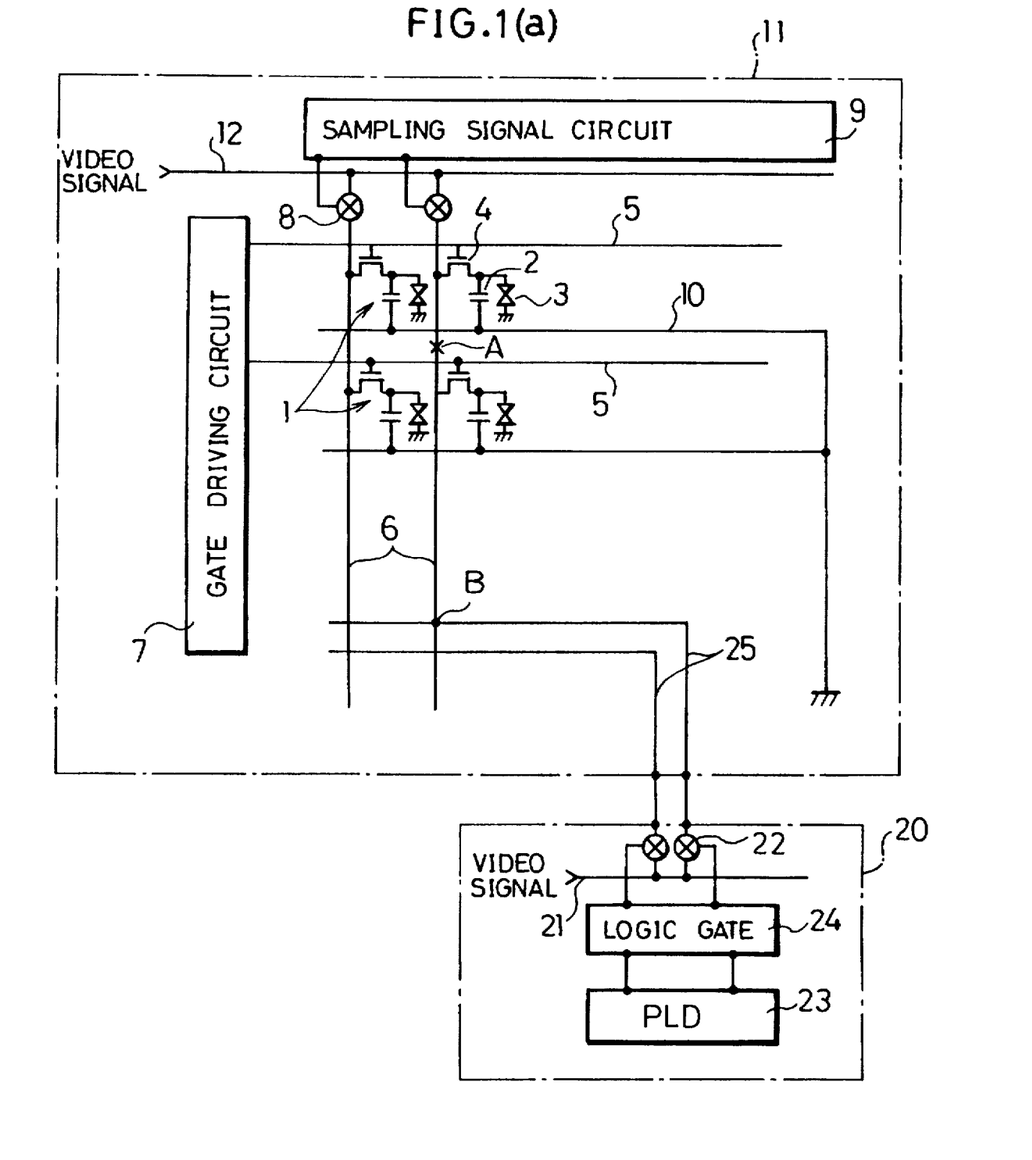
FIG. 1(a) is a schematic drawing which shows a liquid crystal display device that adopts a method for correcting a defect in one embodiment of the present invention.

The following describes one embodiment of the present invention in reference to FIG. 1(a).

As shown in FIG. 1(a), an image display device of the present embodiment is an active matrix-type liquid crystal display device, for example, and such a liquid crystal display device has a plurality of picture elements 1 that are arranged so as to have an orthogonal matrix configuration.

The picture elements 1 are composed of a picture element capacitance 2, an auxiliary capacitance 3 and a picture element TFT 4 as a switching element. The picture elements 1 are formed on a light transmitting-type insulating substrate, such as a glass substrate, not shown, and a gate signal line 5 and a source signal line 6 that are connected to the picture element TFT 4 and that drive the picture elements 1 are also formed on the insulating substrate. The picture elements 1 are respectively placed in positions surrounded by the adjacent source signal lines 6 and the adjacent gate signal lines 5.

The gate signal lines 5 are connected to a gate driving circuit 7 that is formed on the insulating substrate, and the source signal lines 6 are connected to a sampling signal circuit 9 via sampling gates 8. The sampling gates 8 outputs a video signal from a video signal line 12, which has been sampled according to a control signal from the sampling signal circuit 9 composed of a shift register or a logic gate, to each source signal line 6.

Meanwhile, the picture element capacitance 2 is connected to a drain electrode of the picture element TFT 4 on the picture elements 1. The other terminal of each picture element capacitance 2 as well as a counter electrode on a counter substrate, not shown, are grounded via a picture element capacitance common wiring 10. Moreover, a liquid crystal is sealed between a drain electrode of the picture elements TFT 4 and the counter electrode that is opposite to the picture element 1.

In such a manner, in the present embodiment, the picture elements 1, the gate driving circuit 7, the sampling signal circuit 9, the sampling gates 8, etc. are formed on the one insulating substrate, thereby applying a driver monolithic technique that improves mounting efficiency of a circuit element.

In addition, in the present embodiment, a corrective signal supplying circuit 20 as corrective signal supplying means for correcting a line breakdown of the source signal lines 6 is provided as a part of an external circuit that drives a circuit 11 on the insulating substrate.

The corrective signal supplying circuit 20 is composed of a video signal input line 21 to which a video signal is inputted, corrective sampling gates 22 for sampling a video signal from the video signal input line 21, a PLD (Programmable Logic Device) 23 and a logic gate 24 for supplying a control signal of sampling to the corrective sampling gates 22.

Spare wirings 25 that intersect the source signal lines 6 only at ends on the signal non-input sides of the source signal lines 6 are formed from the corrective sampling gates 22. A number of the spare wirings 25 and the corrective sampling gates 22 are not particularly limited, so they may be set accordingly to demand.

The following describes a method for correcting line breakdowns of the corrective signal supplying circuit 20 in the liquid crystal display device having the above arrangement.

When a line breakdown occurs in a line breaking section "A" of the source signal line 6 shown in FIG. 1(a), the corrective signal supplying circuit 20 inspects the operation so as to detect an address of the source signal lines 6 where the line breaking section "A" has been formed. Then, the PLD 23 writes data according to the address of the source signal lines 6 where the line breaking section "A" has been formed. Thereafter, the corrective sampling gate 22 samples a video signal that is timed when display is impossible due to the line breaking section "A" from the video signal input line 21. Then, an intersection "B" of the source signal line 6 where the line breaking section A" is formed and of the spare wiring 25 is irradiated by a laser so as to be connected.

Thereafter, a source signal of the display data according to the address of the line breaking section "A" is supplied to the source signal line 6 from its non-input end via the spare wiring 25 by the externally provided corrective signal supplying circuit 20. As a result, the image data on the line breaking section "A" can be corrected.

In such a manner, in the liquid crystal display device of the present embodiment, since the corrective signal supplying circuit 20 that supplies a corrective signal of display data to the spare wiring 25 is provided at the outside of the circuit 11 on the insulating substrate, if a line break occurs at section "A", the source signal line 6 for section "A" is connected to the spare wiring 25, thereby making it possible to supply a corrective signal to the line breaking section "A".

In addition, the spare wiring 25, that is used when the line breaking section "A" is produced, is formed only on the non-input end of each source signal line 6 or of each gate signal line 5. In other words, when a signal is inputted from the outside of the liquid crystal display device to defective picture elements 1 via the spare wiring 25, the resistance and the parasitic capacitance of the spare wiring 25 are different from those of the normal source signal line 6 because of the picture element capacitance 2 and size of the liquid crystal display device or because of resistance of the source signal line 6 in the circuit 11 on the insulating substrate. Therefore, a difference between the both display states is visually recognized.

However, the spare wiring 25 of the present embodiment is not installed along three sides of the circuit 11 on the insulating substrate in conventional manner, therefore spare wiring 25 has a short length.

As a result, since the parasitic capacitance is small, delay and distortion of display data supplied from the corrective signal supplying circuit 20 do not occur and an offset amount due to feedthrough of the sampling gates 8 is not different from that of display data supplied from the video signal line 12. As a result, the line breaking section "A" can be completely corrected.

Figure 1B:
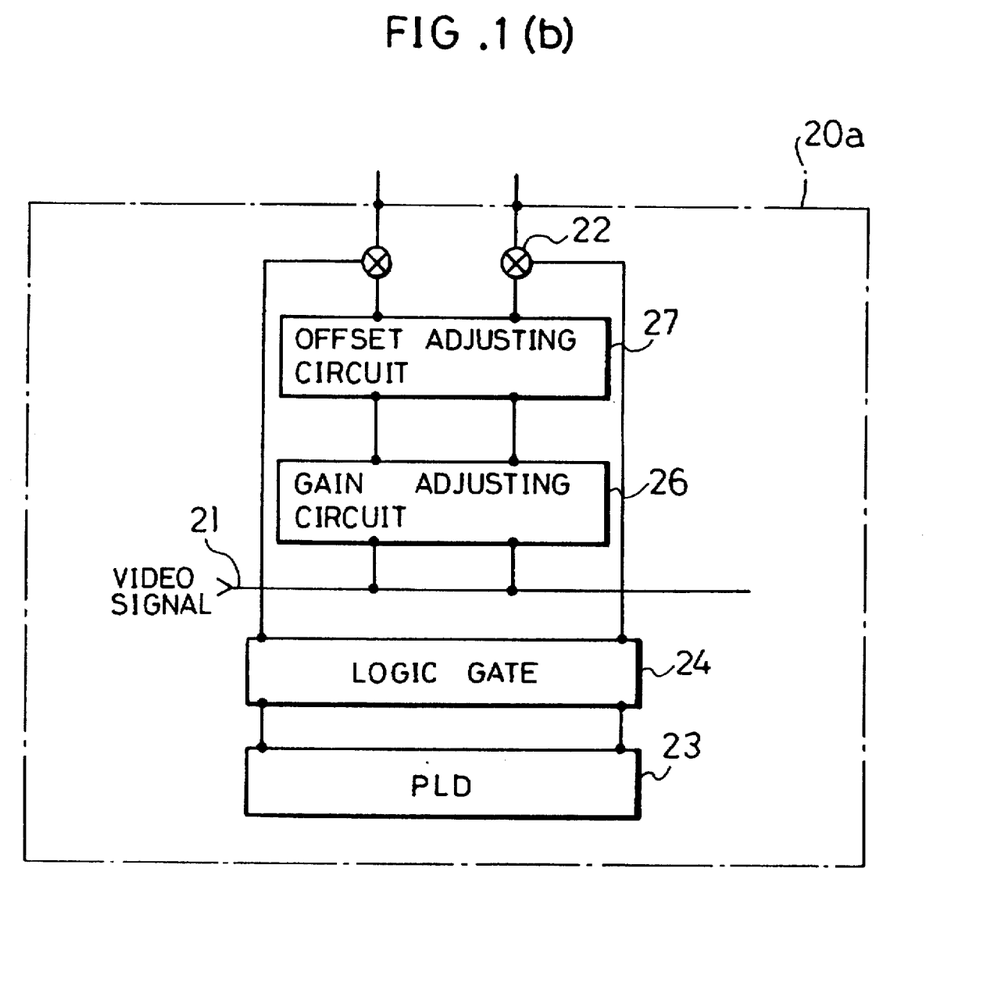
FIG. 1(b) is a schematic drawing which shows one modified example of a corrective signal generating circuit in the liquid crystal display device.

In addition, in the present embodiment, as shown in FIG. 1(b), adjustment may be carried out on per line breaking section "A" by using the corrective signal supplying circuit 20a to which a gain adjusting circuit (level adjusting means) 26 for adjusting a gain of a video signal and an offset adjusting circuit (offset adjusting means) 27 for adjusting an offset of a video signal are added. As a result, also in a driver monolithic liquid crystal display device, the line breaking section "A" can be completely corrected on an non-visually recognizable level, and a ratio of success in correcting defects can be further improved.

In the present embodiment, the level of the video signal used in the PLD 23 and the logic gate 24 of the corrective signal supplying circuit 20 is occasionally different from the level of the video signal to be inputted to the circuit 11 on the insulating substrate. In this case, a level shifter (level adjusting means) may be provided to the output of the logic gate 24.

EMBODIMENT 2

Figure 2:
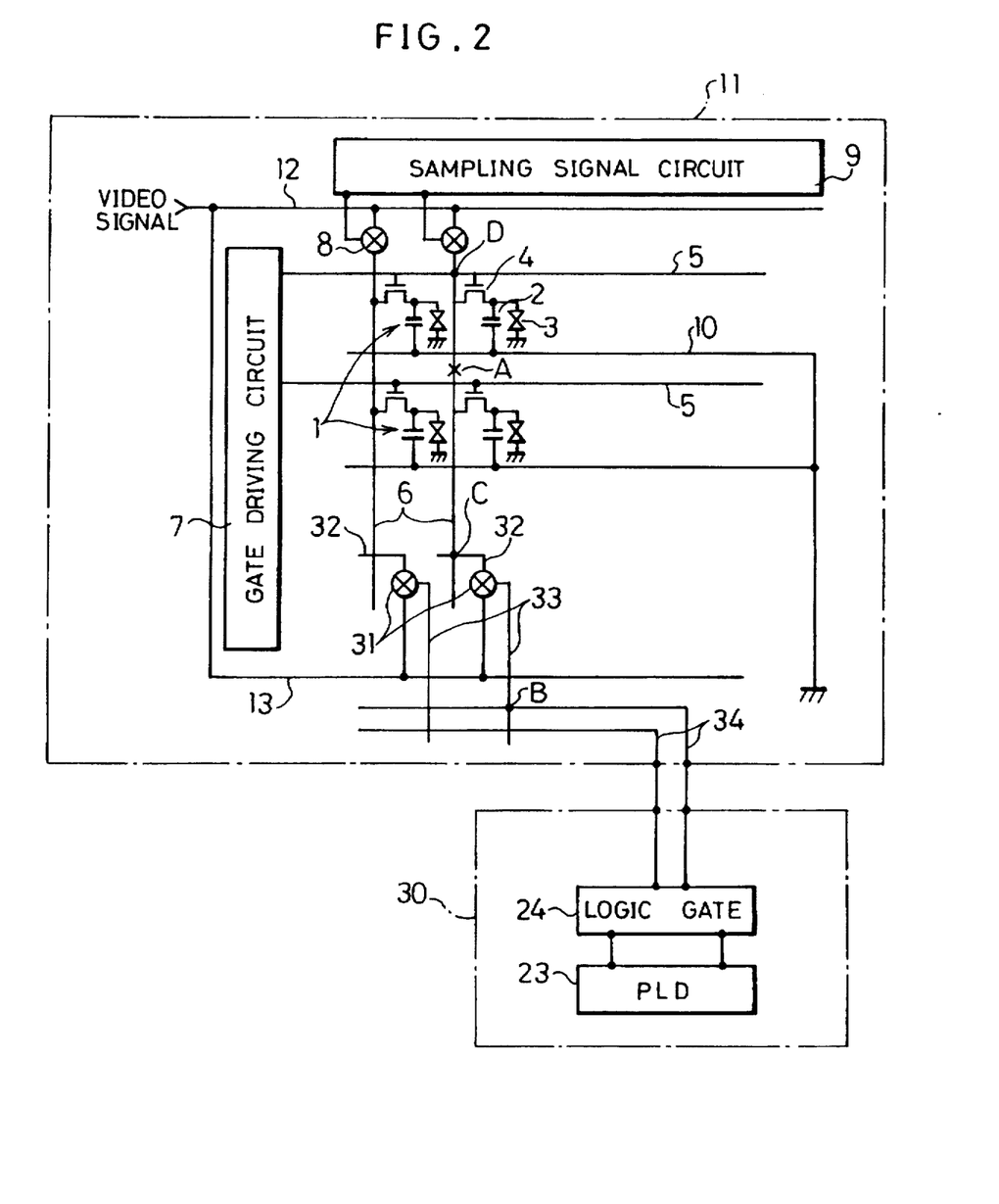
FIG. 2 is a schematic drawing which shows a liquid crystal display device that adopts a method for correcting a defect in another embodiment of the present invention.

The following will discuss another embodiment of the present invention in reference to FIG. 2. Here, for convenience of explanation, those members that have the same arrangement and functions, and that are described in the aforementioned embodiment 1 are indicated by the same reference numerals and the description thereof is omitted.

As shown in FIG. 2, in the circuit 11 on the insulating substrate of the present embodiment, corrective sampling gates 31 are provided to ends on the non-signal input side of the source signal lines 6.

One end of the corrective sampling gates 31 are connected to a branch video signal line 13 branching off from the video signal line 12, and the other end of the corrective sampling gates 31 are connected to control signal lines 32 that intersect the source signal lines 6. The control signal lines 32 can be connected to the source signal lines 6 at the intersection of the non-input end of each source signal line 6.

In addition, gate wirings 33 of the corrective sampling gates 31 are provided so that the gate wirings 33 intersect spare wirings 34 connected to external corrective signal supplying circuit 30. The spare wirings 34 are provided on the inner circumference side of the circuit 11 on the insulating substrate.

Also in the present embodiment, when a break occurs in section "A" on one portion of the source signal line 6, the corrective signal supplying circuit 30 checks the operation so as to detect an address of the source signal lines 6 where the line breaking section "A" is produced. Then, data corresponding to the address of the source signal line 6, where the line breaking section "A" is produced, is written to the PLD 23. Successively, a video signal that is timed when display is impossible due to the line breaking section "A" is sampled by the corrective sampling gate 31 from the branch video signal line 13. Then, an intersection "C" of the source signal line 6 where the line breaking section "A" is produced and of the control signal line 32 is irradiated by a laser so as to be connected. Moreover, an intersection "B" of the gate wiring 33 of the corrective sampling gate 31 and the spare wiring 34 is irradiated by the laser so as to be connected.

Subsequently, a source signal of the display data corresponding to the address of the line breaking section "A" is supplied to the source signal line 6 from its non-input end by the externally provided corrective signal supplying circuit 30 through the spare wiring 34. As a result, the image data on the line breaking section "A" can be corrected.

In such a manner, in the liquid crystal display device of the present embodiment, besides the corrective signal supplying circuit 30 for supplying a control signal to the corrective sampling gate 31 via the spare wiring 34, the branch video signal line 13 branching off from the video signal line 12, the corrective sampling gates 31 for sampling display data from the branch video signal line 13 and the control signal line 32 connected to each corrective sampling gate 31 are provided. Moreover, the non-input ends of each source signal line 6 in the circuit 11 on the insulating substrate intersect the control signal line 32 at the intersection "C" so that they can be connected.

In other words, in the case where a signal is inputted from the outside through the spare wiring 34 to picture elements 1, since the resistance and the parasitic capacitance of the spare wiring 34 are different from those of the source signal lines 6 and gate signal lines 5 because of capacitance and size of a picture element, and because of resistance and parasitic capacitance of each source signal line 6 and each gate signal line 5 in the liquid crystal display device, a difference between the both display states is visually recognized.

However, in the present embodiment, as mentioned above, since besides the corrective signal supplying circuit 30, the corrective sampling gates 31 are provided so as to correct each line breaking section "A". Therefore, even when the arrangement of the corrective signal supplying circuit 30 is simplified, line breakdowns can be securely corrected.

The present invention is not limited to the present embodiments. Various changes are possible within the scope of the present invention. In other words, in the present embodiment, the gate wiring 33 and the spare wiring 34 of the corrective sampling gate 31 can be connected with them intersecting each other, but they are not always limited to this. Therefore, for example, a DC signal that turns the gate wiring 33 OFF is usually inputted to the gate wiring 33 of the corrective sampling gate 31, and only when a line breaking section "A" is produced, the gate wiring 33 for the OFF signal is disconnected so that the corrective sampling gate 31 is turned ON, and a signal can be inputted to the corrective sampling gate 31 from the external corrective signal supplying circuit 30. Here, in this case, an output of each corrective sampling gates 31 may be connected to each source signal line 6.

In addition, the above example referred to the correcting method when the line breaking section "A" is produced at the source signal line 6. If a short circuit between the source signal line 6 and the gate signal line 5 occurs, the source signal line 6 is disconnected in the vicinity of the signal input end of a short circuit section "D" in the source signal line 6 and in the vicinity of the non-signal input end, thereby making it possible to correct the short circuit section "D".

In other words, if the short circuit section "D" is produced between the source signal line 6 and the gate signal line 5, an address of the short circuit section "D" is detected, and an input side and an output side in the vicinity of the short circuit section "D" of the source signal line 6 are disconnected by emitting a laser beam thereon. Then, display data corresponding to the address of the short circuit section "D" are supplied by the externally provided corrective signal supplying circuit 30 from the non-input end of the source signal line 6 through the spare wiring 34.

As a result, since the spare wiring 34 is not necessarily installed along three sides of a display section in the conventional manner, its length can be shortened, thereby decreasing its parasitic capacitance. Therefore, delay and distortion of display data do not occur, and an amount of offsets due to feedthrough of the sampling gate 8 does not vary. Therefore, the short circuit section "D" can be completely corrected.

EMBODIMENT 3

Figure 3:
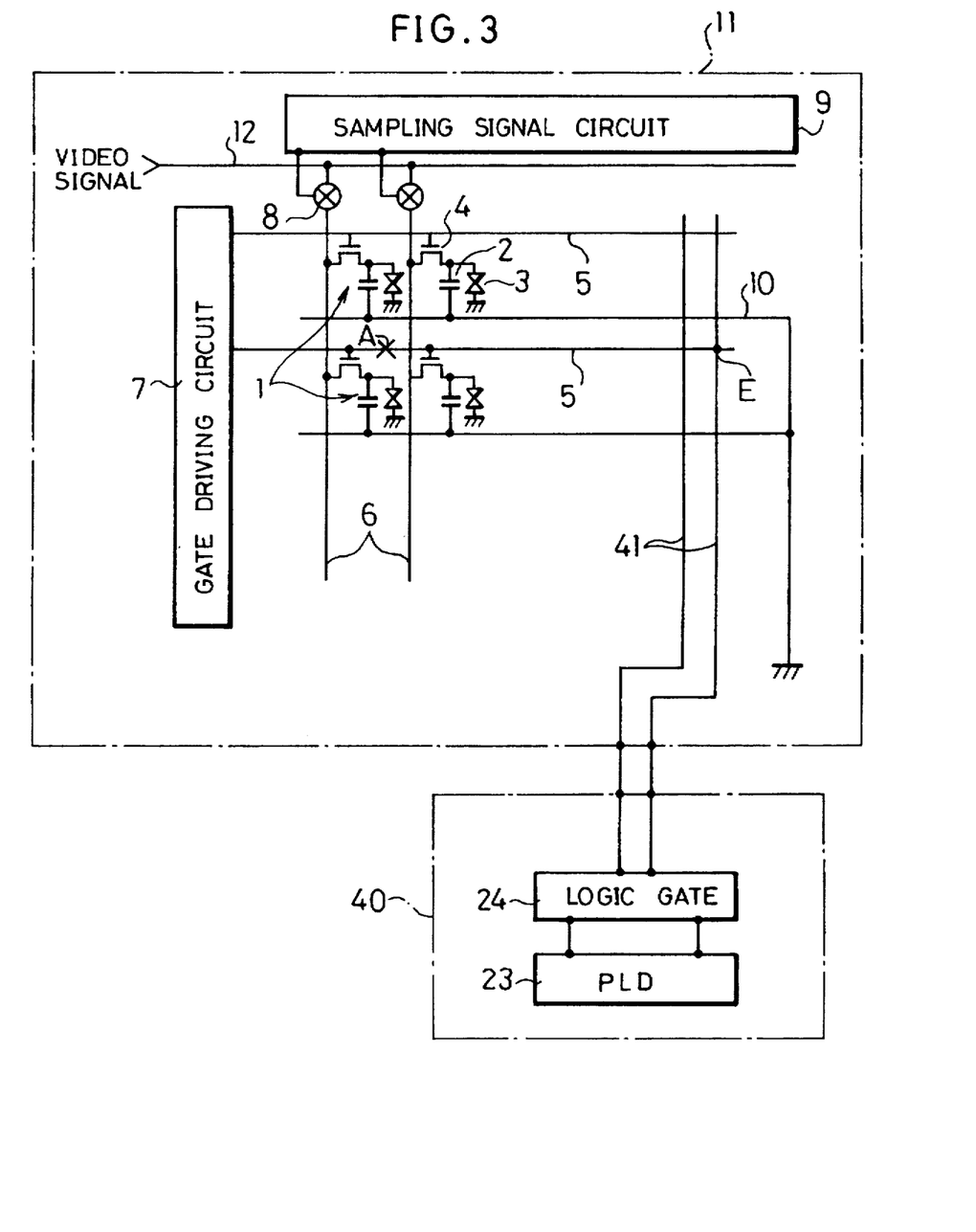
FIG. 3 is a schematic drawing which shows a liquid crystal display device which adopts a method for correcting a defect in still another embodiment of the present invention.

The following describes another embodiment of the present invention in reference to FIG. 3. Here, for convenience of explanation, those members that have the same arrangement and functions, and that are described in the aforementioned embodiments 1 and 2 are indicated by the same reference numerals and the description thereof is omitted.

The present embodiment refers to the correcting method when a line breakdown occurs in the gate signal line 5.

As shown in FIG. 3, ends of the non-signal input sides of the gate signal lines 5 are provided such that they intersect the spare wirings 41 to which a signal is inputted from an externally provided corrective signal supplying circuit 40. A corrective signal is inputted to the spare wirings 41 from the corrective signal supplying circuit 40 as corrective signal supplying means composed of the PLD 23 and the logic gate 24.

Also in the present embodiment, when data corresponding to an address of the gate signal line 5 where a line breaking section "A" occurs are written to the PLD 23, a gate signal of the line breaking section "A" is generated, and an intersection "E" between the spare wirings 41 and the gate signal lines 5 corresponding to the line breaking section "A" is connected by emitting a laser beam thereon. As a result, the line breaking section "A" can be corrected.

In such a manner, in the liquid crystal display device of the present embodiment, since the corrective signal supplying circuit 40, which supplies a corrective signal of a control signal for controlling the picture element TFT 4 to the spare wiring 41, is provided to the outside of the circuit 11 on the insulating substrate, if the line breaking section "A" occurs in the gate signal line 5, a corrective signal can be supplied to the line breaking section "A" by connecting the gate signal line 5, where the line breaking section "A" is produced, to the spare wiring 41.

In addition, the spare wiring 41, which is used when a line breaking section "A" occurs, is formed only at the non-input ends of the gate signal line 5. For this reason, the spare wiring 41 is not installed along three sides of the display section of the circuit 11 on the insulating substrate in conventional manner, so its length is shortened.

As a result, since the parasitic capacitance of the spare wiring 41 can be decreased, delay and distortion of display data supplied from the corrective signal supplying circuit 40 do not occur and amounts of offsets due to feedthrough of the sampling gates 8 are not different from each other. Therefore, the line breaking section "A" can be completely corrected.

As mentioned above, the image display devices of the embodiments 1 through 3 have (1) a plurality of picture elements arranged in a matrix pattern, (2) a plurality of source signal lines and a plurality of gate signal lines for supplying signals to the picture elements that intersect at right angles to one another, and (3) corrective signal supplying circuit for supplying a corrective signal, that is substituted for an input signal of each corrective signal line from the non-input end (i.e. the corrective end) of each revisable signal line and that is provided closer to the corrective end of the non-input side than the input end of the revisable signal line which is at least one of the source signal line and the gate signal line.

The revisable signal line may be one of the source signal line or the gate signal line. Moreover, both of them may be the revisable signal line.

In accordance with the above arrangement, in the case where a defect, such as a line breakdown of a revisable signal line occurs, the corrective signal supplying circuit can supply a corrective signal from the corrective end of the revisable signal line to a defective picture element. Since the corrective signal supplying circuit is provided closer to the non-input side than the input side of the revisable signal line, a length of a supplying path for supplying a signal to a defective picture element can be further shortened compared with the case where a signal to a picture element is supplied to a picture element through three sides of the display section where a plurality of picture elements are provided. Furthermore, a number of intersections of the gate signal line or the source signal line and of the supplying path can be reduced. As a result, resistance and parasitic capacitance of the supplying path can be reduced compared with the conventional one.

In the case where the resistance and parasitic capacitance of the signal supplying path for a defective portion are extremely large compared with those of a normal source signal line or gate signal line, since a display state of a normal picture element is different from a display state of a defective element because of capacitance and a size of picture elements and because of resistance and parasitic capacitance of each source signal line or each gate signal line, the difference in the display state can be visually recognized. In other words, since the resistance and parasitic capacitance are large, delay and distortion occur in a signal to be supplied to a defective picture element, and for example, an offset and a level due to feedthrough of the sampling gate sometimes change. However, since the resistance and parasitic capacitance of the supplying path to a defective picture element can be reduced, the delay, etc. can be controlled, thereby completely correcting a defective portion.

In addition to the above arrangement, the image display device described in the embodiments 1 and 3 have at least one spare wiring, that intersect the non-input end of each revisable signal line at right angles so that it can be connected to the revisable signal line at their intersect, as the signal supplying path. In accordance with this arrangement, when a defective portion is produced, the corrective signal supplying circuit supplies a corrective signal to the defective portion through the spare wiring. Moreover, the spare wiring is formed only at the non-input end of each source signal line or of each gate signal line. For this reason, this spare wiring is not installed along three side of the display section like a conventional spare wiring, so its length becomes short. Therefore, its parasitic capacitance can be securely small, thereby completely correcting a defective portion. The spare wiring can be easily connected to the revisable signal line by emission of a laser beam, etc.

In addition, when a plurality of picture elements arranged in a matrix pattern and a driving circuit of signal lines are integrally formed, the image display device can be formed driver-monolithically, thereby improving mounting efficiency. Moreover, in a driver-monolithic image display device whose ability to drive a signal line is liable to be lowered, a defective portion can be completely corrected. Examples of the driving circuit of the above signal lines are a sampling gate and a source signal driving circuit for controlling the sampling gate or a gate signal driving circuit.

Meanwhile, the image display device of the embodiment 2 has a spare wiring that transmits a generation control signal for controlling generation of a correcting signal instead of a spare wiring that directly transmits the corrective signal. In this case, a generating circuit which is capable of generating a corrective signal, such as a corrective sampling gate, is provided to the corrective end of each revisable signal line. Furthermore, each generation control line that supplies the generation control signal to each generating circuit is formed so as to be connected to the spare wiring. Moreover, the spare wiring is formed so as to be connected to a wiring for generating a generation control signal. Further, the spare wiring is connected to the control circuit for generating a generation control signal.

Also in this case, since the length of the spare wiring can be shortened compared to a conventional one, its parasitic capacitance can be securely small. In addition, each generating circuit, such as a corrective sampling gate, and a plurality of picture elements can be integrally formed, and correction is made per revisable signal line. As a result, the arrangement of the externally provided control circuit can be simplified, and a defective portion can be securely and completely corrected.

In addition, the method for correcting a line breakdown in each image display device has the steps of detecting a defective line that is a revisable signal line where a line breakdown occurs and supplying a corrective signal to the defective line by the corrective signal supplying circuit. As a result, the length of the spare wiring can be shortened unlike a conventional spare wiring that is installed along three sides of a display section, and thus its parasitic capacitance can be small. Therefore, delay and distortion of display data do not occur, and an amount of offsets due to feedthrough of a sampling gate does not vary. Therefore, the defective portion can be completely corrected.

Meanwhile, the method for correcting short circuit has the steps of specifying a short-circuited portion between the source signal line and the gate signal line, disconnecting a defective revisable signal line on both sides of the short-circuited portion and supplying a corrective signal to the defective line by the corrective signal supplying circuit. As a result, the short-circuited portion can be securely corrected. At least one of the source signal line and the gate signal line is always a revisable signal line.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image forming device comprising:
   a plurality of picture elements having a switching element, said picture elements being arranged in matrix pattern;
   a plurality of source signal lines for supplying display data of said picture elements to the switching element;
   a plurality of gate signal lines for supplying a control signal that controls the switching element, said gate signal lines intersecting said source signal lines respectively;
   a corrective signal supplying circuit for supplying a corrective signal, that is substituted for an input signal of each revisable signal line, to each revisable signal line only through their corrective ends, said corrective signal supplying circuit being arranged closer to the corrective end of a non-input side of the revisable signal line than an end of its input side, said revisable signal line being at least one of said source signal lines and said gate signal lines;

at least one spare wiring to which the corrective signal is supplied from said corrective signal supplying circuit, said spare wiring intersecting each revisable signal line only at their corrective ends so that said spare wiring can be connected to each revisable signal line at each intersection;

wherein said corrective signal supplying circuit further includes offset adjusting means for adjusting an offset of display data to be supplied to said spare wiring.

2. An image forming device comprising:

a plurality of picture elements having a switching element, said picture elements being arranged in matrix pattern;

a plurality of source signal lines for supplying display data of said picture elements to the switching element;

a plurality of gate signal lines for supplying a control signal that controls the switching element, said gate signal lines intersecting said source signal lines respectively;

a corrective signal supplying circuit for supplying a corrective signal, that is substituted for an input signal of each revisable signal line, to each revisable signal line only through their corrective ends, said corrective signal supplying circuit being arranged closer to the corrective end of a non-input side of the revisable signal line than an end of its input side, said revisable signal line being at least one of said source signal lines and said gate signal lines;

at least one spare wiring to which the corrective signal is supplied from said corrective signal supplying circuit, said spare wiring intersecting each revisable signal line only at their corrective ends so that said spare wiring can be connected to each revisable signal line at each intersection;

wherein said corrective signal supplying means further includes level adjusting means for adjusting a signal level of display data to be supplied to said spare wiring.

3. A method for correcting a defect of an image display device, wherein said image display device includes:

a plurality of picture elements having a switching element, said picture elements being arranged in a matrix pattern;

a plurality of source signal lines for supplying display data for said picture elements to the switching element;

a plurality of gate signal lines for supplying a control signal that controls the switching element, said gate signal lines intersecting said source signal lines respectively; and a corrective signal supplying circuit for supplying a corrective signal, that is substituted for an input signal of each revisable signal line, to each revisable signal line only through their corrective ends, said corrective signal supplying circuit being arranged closer to the corrective end of a non-input side of the revisable signal line than an end of an input side, said revisable signal line being at least one of said source signal lines and said gate signal lines, said method comprising:

a first step of detecting a defective line that is the revisable signal line where a line breakdown occurs; and a second step of supplying the corrective signal to the defective line by said corrective signal supplying circuit only through a corrective end of the defective line;

further comprising the step of adjusting an offset of the corrective signal to be supplied to said defective line by said corrective signal supplying circuit.

4. A method for correcting a defect of an image display device, wherein said image display device includes:

a plurality of picture elements having a switching element, said picture elements being arranged in a matrix pattern;

a plurality of source signal lines for supplying display data for said picture elements to the switching element;

a plurality of gate signal lines for supplying a control signal that controls the switching element, said gate signal lines intersecting said source signal lines respectively; and a corrective signal supplying circuit for supplying a corrective signal, that is substituted for an input signal of each revisable signal line, to each revisable signal line only through their corrective ends, said corrective signal supplying circuit being arranged closer to the corrective end of a non-input side of the revisable signal line than an end of an input side, said revisable signal line being at least one of said source signal lines and said gate signal lines, said method comprising:

a first step of detecting a defective line that is the revisable signal line where a line breakdown occurs; and a second step of supplying the corrective signal to the defective line by said corrective signal supplying circuit only through a corrective end of the defective line;

further comprising the step of adjusting a level of the corrective signal to be supplied to said defective line by said corrective signal supplying circuit.

* * * * *